(12) United States Patent
Chang

(10) Patent No.: US 8,207,881 B2
(45) Date of Patent: Jun. 26, 2012

(54) HIGH SPEED LOW VOLTAGE FLASH

(75) Inventor: Simon Chang, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 77 days.

(21) Appl. No.: 12/769,784

(22) Filed: Apr. 29, 2010

(65) Prior Publication Data

US 2011/0115662 A1 May 19, 2011

(30) Foreign Application Priority Data

Apr. 29, 2009 (GB) .................................. 0907382.6

(51) Int. Cl.
*H03M 1/34* (2006.01)
(52) U.S. Cl. .......................... 341/158; 341/155; 341/159
(58) Field of Classification Search .................. 341/155, 341/158, 159, 161, 154, 156
See application file for complete search history.

(56) References Cited

U.S. PATENT DOCUMENTS

| | | | | |
|---|---|---|---|---|
| 5,093,664 A * | 3/1992 | Senn et al. | ..................... | 341/156 |
| 5,231,399 A * | 7/1993 | Gorman et al. | ............... | 341/159 |
| 5,345,234 A * | 9/1994 | Stewart et al. | ................ | 341/108 |
| 5,594,444 A * | 1/1997 | Yamada | ........................ | 341/159 |
| 5,721,548 A * | 2/1998 | Choe et al. | ..................... | 341/118 |
| 6,011,503 A * | 1/2000 | Lee | ................................. | 341/159 |
| 6,437,724 B1 * | 8/2002 | Nagaraj | ........................ | 341/159 |
| 6,882,294 B2 * | 4/2005 | Linder et al. | .................. | 341/154 |
| 7,315,272 B2 * | 1/2008 | Li et al. | .......................... | 341/159 |
| 7,528,758 B2 * | 5/2009 | Ishii | ................................. | 341/159 |
| 2003/0043066 A1 * | 3/2003 | Otsuka et al. | ................. | 341/158 |

\* cited by examiner

*Primary Examiner* — Jean B Jeanglaude
(74) *Attorney, Agent, or Firm* — Novak Druce DeLuca + Quigg LLP

(57) ABSTRACT

An analog-to-digital converter comprising: first and second sets of ordered nodes, each first node having a corresponding second node; for each first node, a respective first resistor and current source pair, the resistor of each pair being connected to a first converter input and the current source of each pair being coupled to the respective first node; for each second node, a respective second resistor and current source pair, the resistor of each pair being connected to a second converter input and the current source of each pair being coupled to the respective second node; and a plurality of first comparators, each first comparator having its first input connected to a first node and its second input connected to the corresponding second node; wherein each of the first resistor and current source pairs are configured so as to provide an orderly progression of voltages at the first nodes and each of the second resistor and current source pairs are configured so as to provide an orderly progression of voltages at the second nodes.

20 Claims, 7 Drawing Sheets

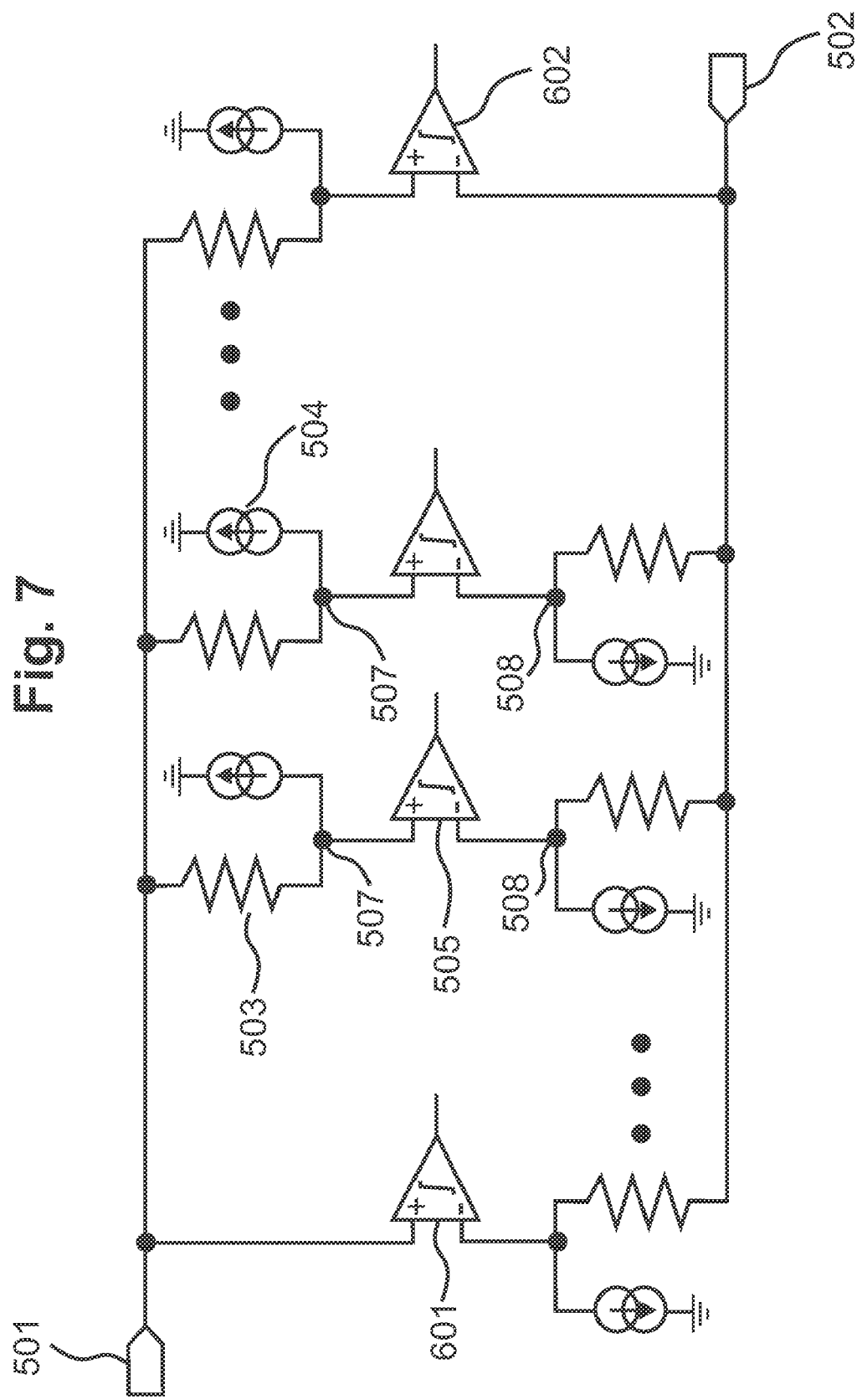

HIGH SPEED LOW VOLTAGE FLASH

BACKGROUND OF THE INVENTION

This invention relates to analog-to-digital converters, in particular, to FLASH analog-to-digital converters having a wide input range.

FIG. 1 shows an example of a conventional "FLASH" or "direct conversion" analog-to-digital converter (ADC). The circuit employs a set of resistors 1 arranged in a chain between a reference voltage 3 and ground (or another reference voltage) to generate a series of voltages at the nodes 5 between the resistors. Typically the resistors all have the same resistance and the variation in voltage from one node to the next is a linear progression. A set of comparators 4 compares the voltage at each of the nodes to the input voltage 2: if the input voltage is higher than the node voltage at a comparator that comparator will saturate and output a '1', otherwise the comparator output will stay low. The comparators will therefore produce a sequence of '1's and '0's at the binary encoder 6 for a given input voltage, with the input voltage level being digitally represented by the point in the sequence at which the '1's switch to '0's. In this manner the input voltage may be digitally sampled to an accuracy determined by the number of comparators (and hence bits).

Such a circuit design suffers from several problems. The accuracy of the ADC is highly dependent on the accuracy and stability of the reference voltage(s) and on the precision of the resistors. Furthermore, the design is susceptible to systematic offset effects in the comparators since all the comparators compare the input voltage to a node voltage dependent on the common reference voltage.

FIG. 2 shows a FLASH ADC having differential inputs. The circuit uses two chains of resistors 20, 29 to generate a series of voltages above the inputs 25, 31 at nodes 22, 32. A pair of current sources 24, 27 connected between voltage rail 28 and the two resistor chains define the voltage at the upper ends of the resistor chains. The comparators 33 are arranged such that the first comparator takes its first input from the first node in the first chain and its second input from the last node in the second chain, the second comparator takes its first input from the second node in the first chain and its second input from the penultimate node in the second chain, and so on, up to the last comparator, which takes its first input from the last node in the first chain and its second input from the first node in the second chain.

When the input voltages 25 and 31 are zero, the voltages at nodes 23 and 30 are equal and the output of comparator 26 is low. When input voltage 25 increases slightly relative to input voltage 31, the voltage at node 23 is higher than that the voltage at node 30 and the output of comparator 26 goes high. When the difference between input voltages 25 and 31 increases by the resolution of the ADC, the output of the next comparator in the series (i.e. one closer to the voltage inputs as shown in FIG. 2) will go high due to the voltage at its first input node being slightly higher than the voltage at its second input node. In this manner the input voltage may be encoded as a binary string, with the input voltage level being digitally represented by the point in the sequence at which the '1's switch to '0's. The binary string is typically encoded by a binary encoder to minimise the amount of redundant information. Thus, an ADC having 64 comparators will output a string of 6 bits. The number of bits is representative of the accuracy of the ADC.

FIG. 3 illustrates the input range of the ADC shown in FIG. 2. The input range is approximately half of the rail-to-rail voltage available to the ADC. This is because it is only possible for half of the comparators (those below comparator 26 in FIG. 2) to be at or close to their thresholds—and therefore relevant to the analogue-to-digital conversion—when input voltage 25 is higher than input voltage 31. The other half are relevant when input voltage 25 is lower than input voltage 31.

The input voltage range is restricted by the fact that a constant current flows through the chain of resistors 20 and therefore the voltage dropped across the total length of the resistor chain is fixed. The highest input voltage that can be measured is less than the rail voltage 28 minus the total voltage dropped across the resistor chain. For optimum operation, the total voltage dropped across the resistor chain is set to be approximately half the available rail voltage. Thus at the highest measurable input voltage, the voltage at node 34 is slightly lower than the input voltage 25 and the output of the final comparator 19 in the series goes high.

The input range 36 is further limited by the fact that the current sources typically require a minimum voltage 38 across them in order to maintain the current at its predetermined level. Thus, there is a maximum voltage allowed at the output of the current source before the MOSFET (or other suitable transistor) controlling the current is driven into linear mode and the current (and hence the converter) will no longer be accurate. This voltage is $V_{DD}-E_P$, where $E_P$ is the drain-source voltage 38 required to keep the current source saturated and $V_{DD}$ is the rail voltage 35. At the bottom end, the input voltage is limited by how low the driving amplifier can pull the input voltage. Typically the driving amplifier cannot pull the input all the way down to ground. The minimum input voltage is designated by $E_N$, 39 in FIG. 3. The input range of the ADC shown in FIG. 2 is therefore at most $0.5*(V_{DD}-E_P-E_N)$.

The circles 37 in FIG. 3 represent the crossover points at the threshold of each bit value, i.e. each point corresponds to the voltage at which the output of a given comparator switches from low to high or vice versa. Note that the threshold voltage is the same for all the comparators.

The desire to reduce operating temperatures and increase the speed of digital electronics is pushing down the operating voltages of digital electronics. It is therefore becoming more important to make the most efficient use of the available voltage range in devices such as analogue-to-digital converters. At lower voltage levels, the noise introduced by electronic components becomes more significant and, without careful design, lower tolerances are required of component values which generally increases the area of silicon required. There is therefore a need for an ADC having a large input voltage range (ideally rail-to-rail) and a high tolerance to internal offset voltages.

SUMMARY OF THE INVENTION

According to a first aspect of the present invention there is provided an analog-to-digital converter comprising: first and second sets of ordered nodes, each first node having a corresponding second node; for each first node, a respective first resistor and current source pair, the resistor of each pair being coupled between the first node and a first converter input and the current source of each pair being coupled to the respective first node; for each second node, a respective second resistor and current source pair, the resistor of each pair being coupled between the first node and a second converter input and the current source of each pair being coupled to the respective second node; and a plurality of first comparators, each first comparator having its first input connected to a first node and its second input connected to the corresponding second node; wherein each of the first resistor and current source pairs are configured so as to provide an orderly progression of voltages at the first nodes and each of the second resistor and current source pairs are configured so as to provide an orderly progression of voltages at the second nodes.

Preferably the voltages at a first subset of the first nodes form an orderly progression of voltages between the voltage at the first converter input and the upper supply voltage and the voltages at a second subset of the first nodes form an orderly progression of voltages between the voltage at the first converter input and the lower supply voltage.

Preferably the voltages at a first subset of the second nodes form an orderly progression of voltages between the voltage at the second converter input and the upper supply voltage and the voltages at a second subset of the second nodes form an orderly progression of voltages between the voltage at the second converter input and the lower supply voltage.

Preferably the respective current sources of the first subset of first nodes and the second subset of second nodes are sinking current sources, and the respective current sources of the second subset of first nodes and the first subset of second nodes are sourcing current sources.

Preferably the analog-to-digital converter further comprises a second comparator having its first input connected to the first converter input and its second input connected to the second converter input.

Preferably the first and second sets of nodes each have N nodes and the total number of first and second comparators is N, each comparator having its first and second inputs connected such that a comparator having its first input connected to the node at position x in the first set has its second input connected to the node at position N+1−x in the second set, where x=1 at the nodes adjacent to the first and second converter inputs and x=N at the nodes at the terminating ends of the first and second ordered sets of nodes, the remaining nodes in each set being arranged in successive order therebetween.

In the half-range embodiment, the voltages at the first nodes suitably form an orderly progression of voltages between the voltage at the first converter input and the upper supply voltage and the voltages at the second nodes form an orderly progression of voltages between the voltage at the second converter input and the upper supply voltage. Alternatively the voltages at the first nodes form an orderly progression of voltages between the voltage at the first converter input and the lower supply voltage and the voltages at the second nodes form an orderly progression of voltages between the voltage at the second converter input and the lower supply voltage. Suitably the respective current sources of the first and second nodes are sinking current sources. Suitably the analog-to-digital converter further comprises a third comparator having its first input connected to the first converter input and its second input connected to the last node in the ordered set of second nodes. Suitably the analog-to-digital converter further comprises a fourth comparator having its second input connected to the second converter input and its first input connected to the last node in the ordered set of first nodes.

Preferably the first and second converter inputs are a pair of differential inputs. Alternatively the first converter input voltage is a single-ended input voltage and the second converter input voltage is synthesised from the first converter input voltage so as to maintain the midpoint voltage between the two converter input voltages at the midpoint voltage between the upper and lower supply voltages supplied to the analog-to-digital converter.

Preferably each said resistor has the same nominal resistance and each said current source is configured to provide a predetermined multiple of a fixed current.

Preferably the predetermined multiples are chosen such that, in the absence of input voltages at the first and second converter inputs, the voltages on the nodes in each of the first and second sets form a linear progression. Alternatively the predetermined multiples are chosen such that, in the absence of input voltages at the first and second converter inputs, the voltages on the nodes in each of the first and second sets form a logarithmic progression.

Preferably the first and second converter input voltages are biased such that the midpoint voltage between the two converter input voltages is maintained at the midpoint voltage between the upper and lower supply voltages supplied to the analog-to-digital converter.

According to a second aspect of the present invention there is provided an electronic device comprising an analog-to-digital converter as described herein.

According to a third aspect of the present invention there is provided an integrated circuit comprising an analog-to-digital converter as described herein.

BRIEF DESCRIPTION OF THE DRAWINGS

The present invention will now be described by way of example with reference to the accompanying drawings, in which:

FIG. 7 is a circuit diagram of a FLASH ADC in accordance with a first embodiment of the present invention.

DETAILED DESCRIPTION OF THE INVENTION

The following description is presented to enable any person skilled in the art to make and use the invention, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
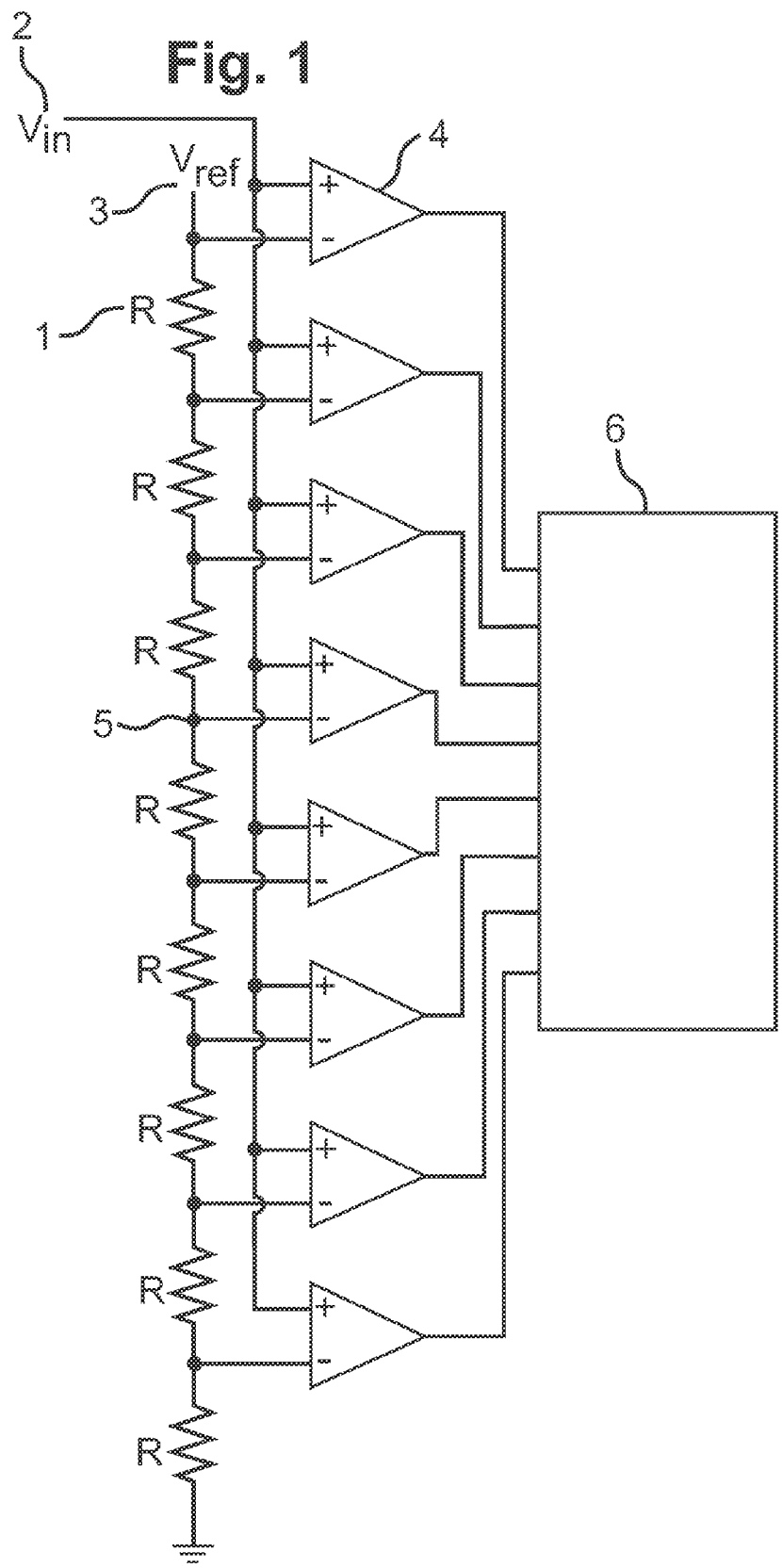
FIG. 1 is a circuit diagram of a conventional FLASH ADC.
Figure 2:
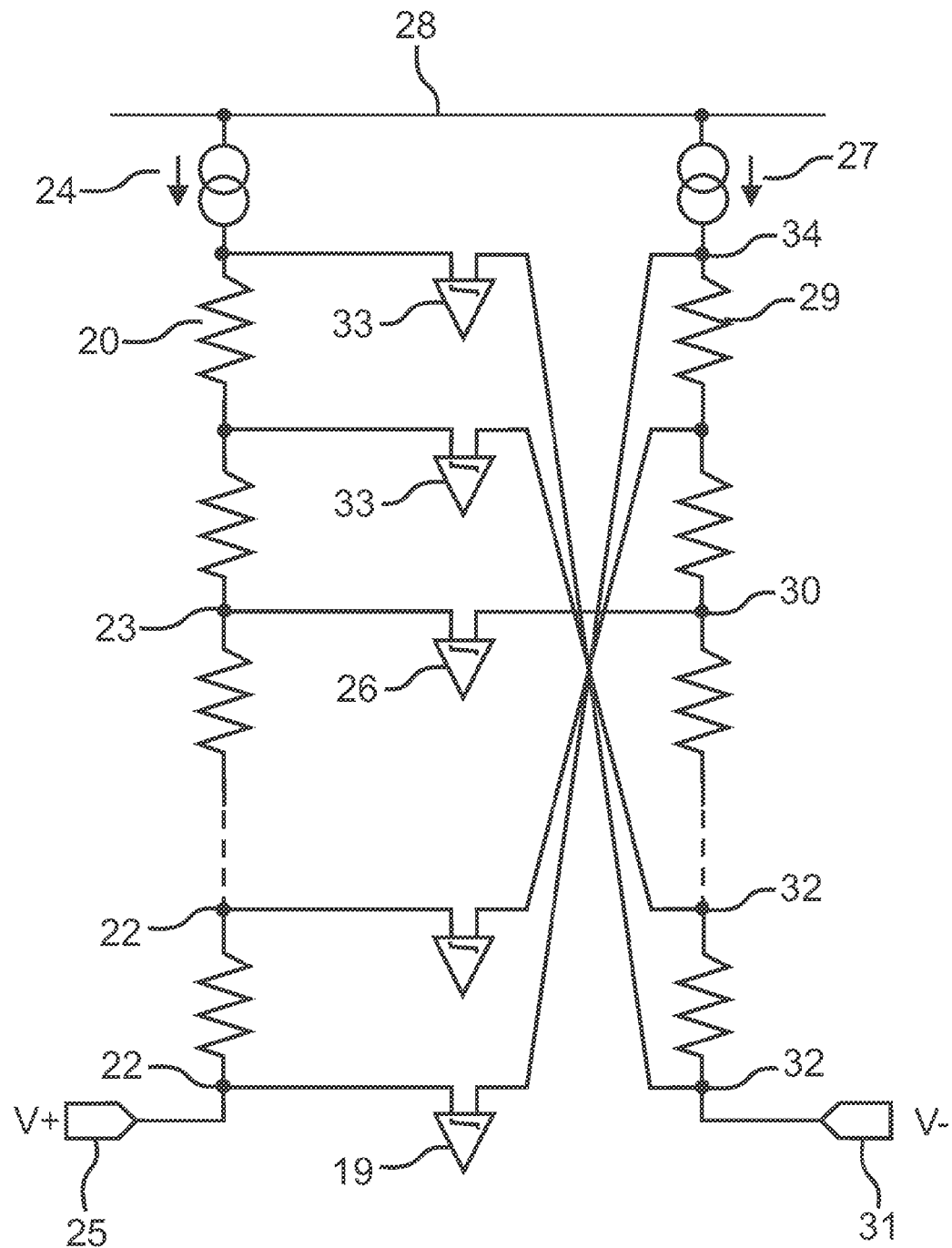
FIG. 2 is a circuit diagram of a differential-input FLASH ADC.
Figure 3:
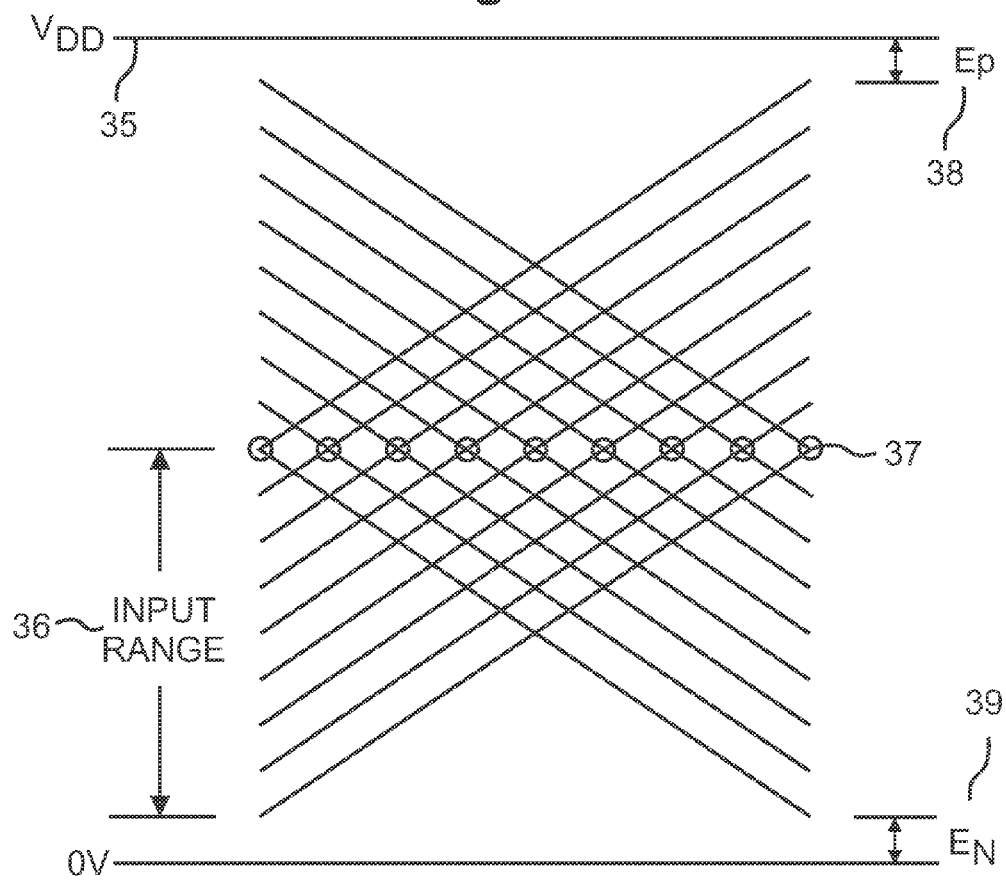
FIG. 3 illustrates a typical input range of the differential-input FLASH ADC shown in FIG. 2.
Figure 4:
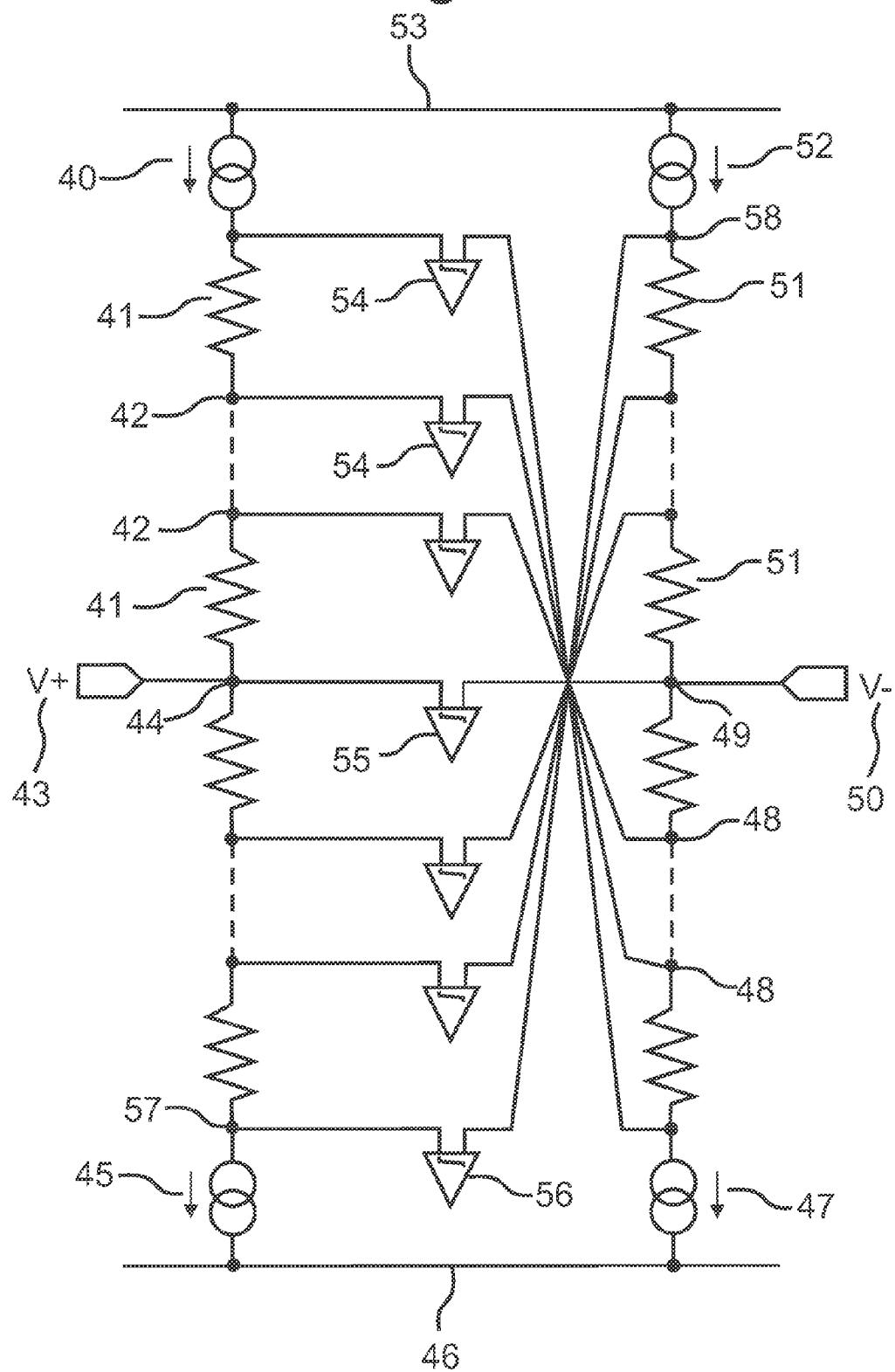
FIG. 4 is a circuit diagram of an improved FLASH ADC.

FIG. 4 shows a FLASH ADC circuit having improved characteristics over the conventional FLASH ADC shown in FIG. 1. The circuit comprises two sets of nodes forming chains of nodes 42 and 48, each chain extending between the upper and lower voltage rails 53 and 46. Adjacent nodes are separated by resistors 41 and 51 such that the resistor chains generate a set of "delta-voltages" between adjacent nodes.

Each chain of nodes has a current source 40, 52 between the upper end of the chain and the upper voltage rail, and a current sink 45, 47 between the lower end of the chain and the lower voltage rail. In FIG. 4, the first differential input 43 is connected at the midpoint node 44 of the first chain, the second differential input 50 is connected at the midpoint node 49 of the second chain, and the first and second chains have an equal number of nodes. The first and second differential inputs are connected such that there is at least one node between each input and the relevant current source and between each input and the relevant current sink.

A set of comparators 54 compares the voltages at nodes of the first chain with the voltages at nodes of the second chain. The number of comparators is equal to the number of nodes in each of the first and second chains and the comparators are configured as follows. The first comparator in the set takes its first input from the first node in the first chain and its second input from the last node in the second chain, the second comparator takes its first input from the second node in the first chain and its second input from the penultimate node in the second chain, and so on, up to the last comparator, which takes its first input from the last node in the first chain and its second input from the first node in the second chain.

The FLASH ADC shown in FIG. 4 improves upon the circuit design shown in FIG. 1. Firstly, because of the way in which the comparator inputs are taken from opposite ends of the resistor chain, the common-mode comparator input voltage at the threshold of each bit is the same. This removes systematic offset effects in the comparator and simplifies its design. Secondly, because the differential inputs to the ADC are connected at the nodes at the midpoints of the first and second chains there are comparators connected so as to sample the voltages generated at the nodes both above and below the inputs. This allows the ADC to convert input voltages over almost the entire rail-to-rail voltage range. It will be apparent to the skilled person that many of these advantages are present in other embodiments of the present invention.

An ADC operating in accordance with the present invention has an input range almost as wide as the rail-to-rail voltage. The ADC therefore has a greater tolerance to offset voltages caused by its internal components (such as resistors and comparators) than an ADC having a smaller input range. This allows the internal components to be designed to use less silicon area, making the ADC more economical and easier to integrate with low voltage digital electronics. Furthermore, the ability of the ADC to utilize almost the full rail-to-rail voltage range allows it to convert input signals over the same input range as, but operate at lower supply voltages than, conventional ADCs.

Figure 5:
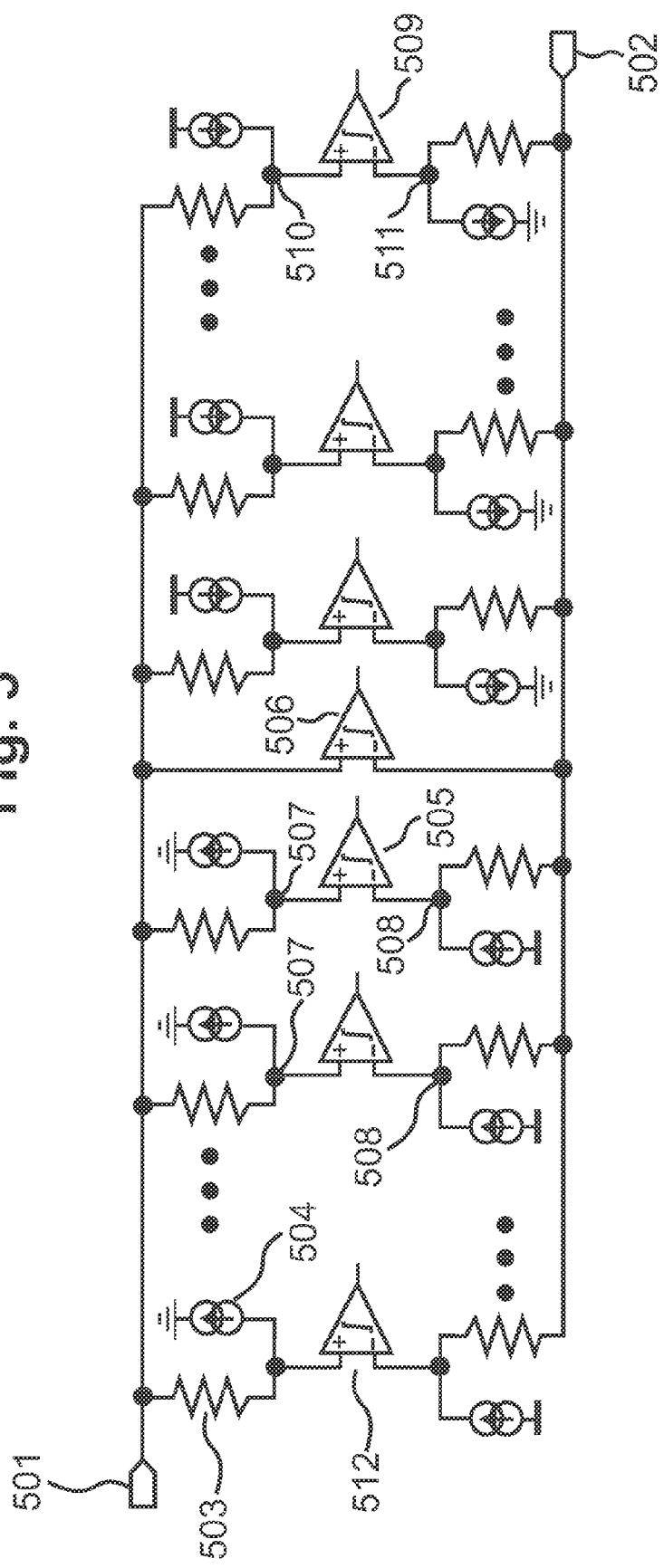
FIG. 5 is a circuit diagram of a FLASH ADC in accordance with a first embodiment of the present invention.

The present invention further improves on the FLASH ADC circuit shown in FIG. 4. A circuit configured in accordance with the present invention is shown in FIG. 5. The circuit comprises two sets of nodes 507 and 508: the first set of nodes 507 providing a chain of predetermined voltages from the voltage at the first input 501 of the analog-to-digital converter; the second set of nodes providing a chain of predetermined voltages from the voltage at the second input 502 of the analog-to-digital converter. The voltages dropped between adjacent nodes in the first and second sets may be termed "delta-voltages".

Each node of the first and second sets its established by means of a resistor-current source pair. Thus a first node is coupled to the first converter input 501 by a resistor 503 and to a current source 504. By arranging for each current source to provide a predetermined current through the corresponding resistor of the resistor-current source pair, the voltage at the node formed by the resistor-current source pair may be fixed at a predetermined potential difference from the respective converter input. The voltage at each node may be determined through the choice of resistor and current level provided by the current source. Thus, by appropriate choice of resistor values and the current level provided by each current source, the first and second nodes may be configured to provide a set of voltages above and below the first and second input voltages, respectively.

A set of comparators 505 are connected between the first and second nodes so as to form the basis of an analog-to-digital converter (ADC): the outputs of the converters providing the digital bits which identify the converter input voltage to within the resolution of the converter. The resolution of the converter is determined by the width of the "delta-voltages" formed by the first/second nodes above and below the first/second converter inputs. As shown in FIG. 5, there are an equal number of comparators, first nodes and second nodes. Additionally, there is preferably a further comparator 506 coupled between the first and second converter inputs and not between nodes defined by resistor-current source pairs.

Each comparator 505 takes its inputs from a corresponding pair of first and second nodes. Thus, the first comparator in the ordered set of comparators 505 takes its first input from the highest-voltage first node and the highest-voltage second node, the next comparator takes its inputs from the second-highest-voltage first node and the second-highest-voltage second node, and so on, down to the last comparator. This arrangement is shown in FIG. 5.

Preferably, the resistor-current source pairs of the ADC are configured such that some of the first nodes provide voltages above the first converter input and some of the first nodes provide voltages below the first converter input. Similarly, the second nodes are preferably configured such that some of the second nodes provide voltages above the second converter input and some of the second nodes provide voltages below the second converter input. Most preferably there are an equal number of nodes above and below the converter inputs such that the additional comparator 506 (connected directly between the first and second converter inputs) occurs in the middle of the comparators 505 (which compare the voltages at the first and second nodes) when those comparators are arranged in order of the voltages at the first or second nodes.

The circuit shown in FIG. 5 is configured to accept a pair of differential inputs at converter inputs 501 and 502, with input 501 being the positive differential input and input 502 being the negative differential input. The inputs may be pseudo-differential inputs formed from a single-ended input and a reference voltage, such as ground or a supply voltage. Alternatively, one of the inputs may be fixed and the other a single-ended input.

The current sources are most easily arranged as shown in FIG. 5, although other configurations could be used. Thus, the current sources corresponding to the first nodes at voltages between the first converter input voltage and the upper supply voltage are sinking current sources; the current sources corresponding to the first nodes at voltages between the first converter input voltage and the lower supply voltage (ground) are sourcing current sources; the current sources corresponding to the second nodes at voltages between the second converter input voltage and the upper supply voltage are sourcing current sources; and the current sources corresponding to the second nodes at voltages between the second converter input voltage and the lower supply voltage (ground) are sinking current sources.

Preferably the range of voltages over the first nodes, and over the second nodes, extends between the upper and lower supply voltages. For true differential inputs it is also important that the set of delta voltages (i.e. the spacing of the voltages) at the first nodes are equivalent to the set of delta voltages at the second nodes. Thus the range of voltages across the first nodes is equal to the range of voltages across the second nodes.

In order to avoid introducing internal biases during manufacture, it is advantageous if all the resistors of the resistor-current source pairs of the first and second sets are identical, with the voltage variation being due to a predetermined variation in the current level provided by each current source. For example, in a proposed structure of the ADC, each current source pushes or pulls an integer multiple k of a fixed bias current through the corresponding resistor of that resistor-current source pair. Thus, a given current source will provide a voltage at the corresponding node equal to the relevant converter input voltage plus $k \cdot I_{bias} R$, where k is the predetermined current multiplier for the current source, $I_{bias}$ is the fixed bias current for the converter, and R is the resistance of each resistor of h resistor-current source pairs.

The arrangement of comparators shown in FIG. 5 may be readily expressed using this notation: the comparators are connected to the resistors in such a way as to compare $V_{POS} + k \cdot I_{bias} R$ with $V_{NEG} - k \cdot I_{bias} R$, where $V_{POS}$ is the positive differential converter input, $V_{NEG}$ is the negative differential converter input, and k is the same for the first and second nodes being compared. k ranges between $-N$ and $+N$, where N is the number of comparators arranged to compare voltages at first and second nodes. Comparator 506 connected directly between the first and second converter inputs may be considered to be the N=0 comparator. The number of levels detected by the ADC structure is $2 \cdot (N+1)$.

Because of the way in which the comparator inputs are taken from opposite ends of the resistor network, the common-mode comparator input voltage at the threshold of each bit is always the same. This removes systematic offset effects in the comparator and simplifies circuit design.

In the case in which case the delta-voltages are all equal, the circuit generates a series of equally-spaced voltages at the nodes of each chain (i.e. there is a linear relationship between the position of a node in the chain and its voltage and k varies in a linear fashion). Alternatively, the delta-voltages may be set by the choice of current source level and/or resistor value of each resistor-current source pair so as to define a logarithmic progression of voltages at the nodes of each of the first and second chains (k varies in a logarithmic fashion), or any other progression of voltages.

The current sources and sinks may be of any design. Preferably they are each based around a MOSFET, but they may be based around any type of transistor. Suitably, input circuitry (not shown) provides the inputs to the ADC. The input circuitry may ensure that the input voltages lie within the range measurable by the ADC. It is advantageous if the input circuitry includes one or more driving amplifiers that can provide a pair of input voltages to the ADC which are substantially independent of the current drawn/sunk by the ADC from/at its inputs across the input voltage range of the ADC.

It is further advantageous if the differential ADC inputs are biased by the input circuitry such that the midpoint between the two input voltages is maintained at the midpoint voltage between the upper and lower voltage rails of the ADC. This leads to the maximum input range for the ADC. Alternatively, as described above, the ADC inputs may not be true differential inputs and one of the ADC inputs may be synthesised from the signal for conversion so as to provide a pair of inputs. In this case, the synthesised ADC input is preferably chosen so as to maintain the midpoint between the two input voltages at the midpoint between the upper and lower voltage rails.

This operation of an ADC configured in accordance with the present invention can be understood by considering the effect of a high voltage at converter input 501 relative to input 502, such that the output of all the comparators is high with the exception of comparator 509. A high input voltage 501 pulls up the voltages at first nodes 507, and a low input voltage 502 pulls down the voltages at second nodes 508. When the input voltage 501 increases sufficiently to pull the voltage at node 510 up above the voltage at node 511, the output of comparator 509 will go high. At this point the voltage at node 510 has been pulled up to, and the voltage at node 511 has been pulled down to, the voltage level halfway between the supply voltages. This is the threshold voltage at which all the comparators switch. Since comparator 509 is the last in the series, the voltage at which this comparator switches is the highest input voltage that can be digitally represented.

By an analogous consideration of the effect of a low voltage at input 501 relative to input 502, it can be seen that the total useful ADC input voltage range is defined by the potential difference between the voltage at which comparator 511 switches and the voltage at which comparator 512 switches. By arranging the voltages at the first and second sets of nodes to span between the upper and lower supply voltages, the input range of the converter can be as large as the voltage supply. This is an important advantage over conventional circuits because, as process geometries shrink, the available voltage supply decreases—it is therefore advantageous to be able to use all of it.

Because the current sources are always driving into the common-mode voltage when each voltage comparison is performed, the voltage across them is maintained at roughly half of the supply voltage. This allows each current source to be a small device whilst maintaining the accuracy of the current level and hence the node voltages. Furthermore, extending the input range of the ADC reduces the accuracy requirements for the resistors and comparators of which it comprises—this has advantages in terms of reduced silicon area and current consumption.

An additional benefit of ADC configured in accordance with the present invention is that the circuits formed between the input nodes and the comparator inputs have a reduced resistor-capacitor (R-C) time constant with respect to ADC configurations using chains of resistors in series. This is because the R-C circuits present in the circuits of the present invention are effectively in parallel, rather than in series. This allows faster operation of the ADC and/or a reduced operating current to be used.

Figure 6:
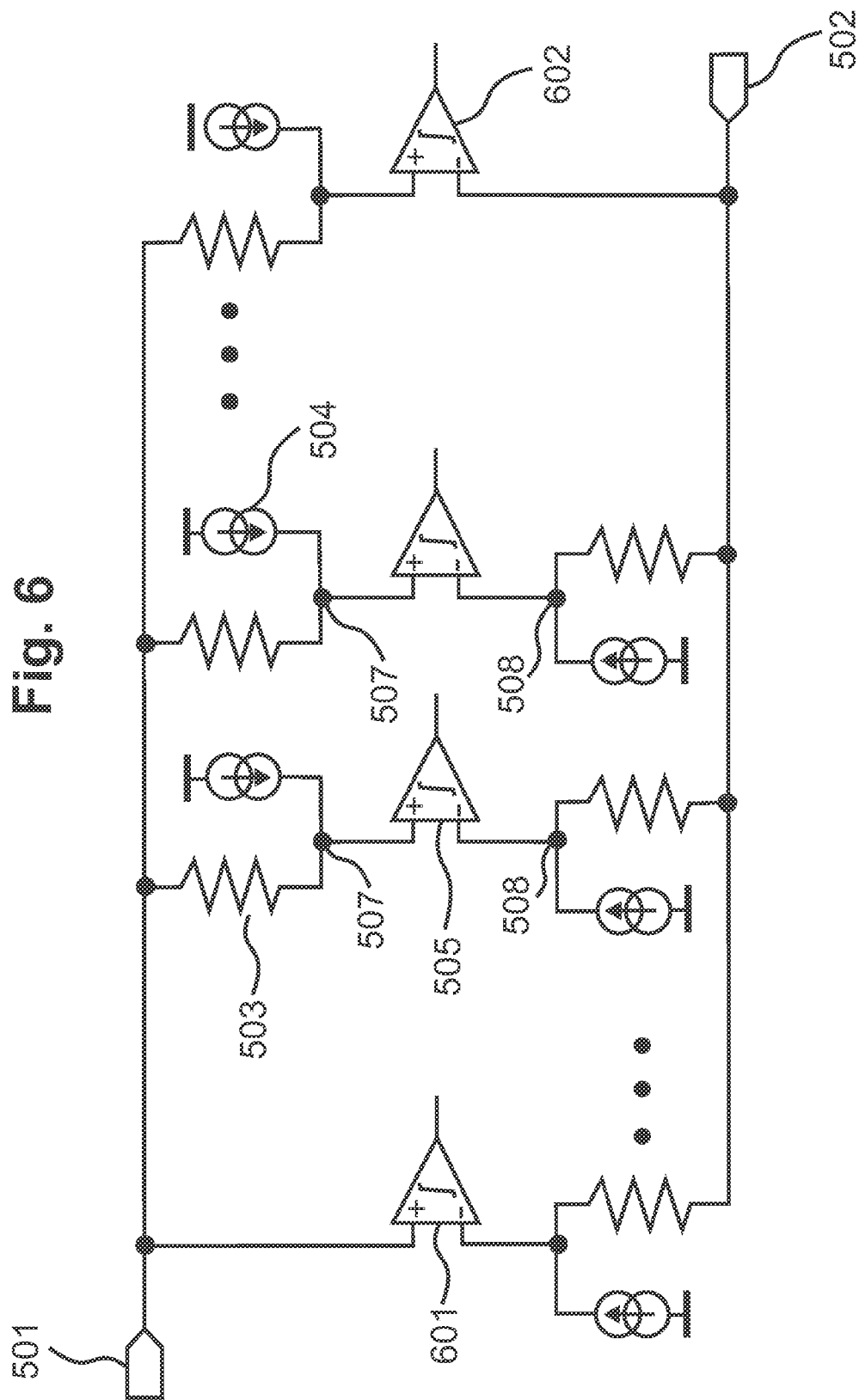
FIG. 6 is a circuit diagram of a FLASH ADC in accordance with a first embodiment of the present invention.

In alternative embodiments of the present invention, the ADC can be configured using only half of the available supply voltage range. Example embodiments are shown in FIGS. 6 and 7, with circuit elements common to those figures and FIG. 5 sharing the same references. FIG. 6 shows a half-range ADC which uses only sourcing current sources and FIG. 7 shows a half-range ADC which uses only sinking current sources.

A half-range ADC configured in accordance with the principles of the present invention includes a set of comparators arranged to compare the voltages at first and second sets of nodes defined by resistor-current source pairs. The first and second sets of nodes are arranged to provide a set of delta voltages above (FIG. 6, using sourcing current sources) or below (FIG. 7, using sinking current sources) the converter inputs. Additionally, the ADC may further include comparators 601 and 602 as shown in FIGS. 6 and 7. Comparator 601 is connected directly between the positive converter input and a second node; comparator 602 is connected directly between the negative converter input and a first node.

As for the full-range ADC, converter inputs 501 and 502 are preferably a pair of differential inputs, but may instead be a synthesised pair of differential inputs, or a single ended input and a fixed reference voltage, as described above. The half-range ADCs shown in FIGS. 6 and 7 share the advantages of the full-range ADCs in that the parallel current sourcing circuit arrangement improves the input range and speed and can reduce the operating current of the ADC.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An analogue to digital converter comprising:
   first and second sets of ordered nodes, each first node having a corresponding second node;
   for each first node, a respective first resistor and current source pair, the resistor of each pair being coupled between the first node and a first converter input and the current source of each pair being coupled to the respective first node;
   for each second node, a respective second resistor and current source pair, the resistor of each pair being coupled between the second node and a second converter input and the current source of each pair being coupled to the respective second node; and
   a plurality of first comparators, each first comparator having its first input connected to a first node and its second input connected to the corresponding second node;
   wherein each of the first resistor and current source pairs are configured so as to provide an orderly progression of voltages at the first nodes and each of the second resistor and current source pairs are configured so as to provide an orderly progression of voltages at the second nodes.

2. An analogue to digital converter as claimed in claim 1, wherein the voltages at a first subset of the first nodes form an orderly progression of voltages between the voltage at the first converter input and an upper supply voltage and the voltages at a second subset of the first nodes form an orderly progression of voltages between the voltage at the first converter input and a lower supply voltage.

3. An analogue to digital converter as claimed in claim 2, wherein the voltages at a first subset of the second nodes form an orderly progression of voltages between the voltage at the second converter input and the upper supply voltage and the voltages at a second subset of the second nodes form an orderly progression of voltages between the voltage at the second converter input and the lower supply voltage.

4. An analogue to digital converter as claimed in claim 3, wherein the respective current sources of the first subset of first nodes and the second subset of second nodes are sinking current sources, and the respective current sources of the second subset of first nodes and the first subset of second nodes are sourcing current sources.

5. An analogue to digital converter as claimed in claim 1, further comprising a second comparator having its first input connected to the first converter input and its second input connected to the second converter input.

6. An analogue to digital converter as claimed in claim 5, wherein the first and second sets of nodes each have N nodes and the total number of first and second comparators is N, each comparator having its first and second inputs connected such that a comparator having its first input connected to the node at position x in the first set has its second input connected to the node at position N+1−x in the second set, where x=1 at the nodes adjacent to the first and second converter inputs and x=N at the nodes at the terminating ends of the first and second ordered sets of nodes, the remaining nodes in each set being arranged in successive order therebetween.

7. An analogue to digital converter as claimed in claim 1, wherein the voltages at the first nodes form an orderly progression of voltages between the voltage at the first converter input and an upper supply voltage and the voltages at the second nodes form an orderly progression of voltages between the voltage at the second converter input and an upper supply voltage.

8. An analogue to digital converter as claimed in claim 7, wherein the respective current sources of the first and second nodes are sourcing current sources.

9. An analogue to digital converter as claimed in claim 1, wherein the voltages at the first nodes form an orderly progression of voltages between the voltage at the first converter input and a lower supply voltage and the voltages at the second nodes form an orderly progression of voltages between the voltage at the second converter input and a lower supply voltage.

10. An analogue to digital converter as claimed in claim 9, wherein the respective current sources of the first and second nodes are sinking current sources.

11. An analogue to digital converter as claimed in claim 7, further comprising a third comparator having its first input connected to the first converter input and its second input connected to the last node in the ordered set of second nodes.

12. An analogue to digital converter as claimed in claim 7, further comprising a fourth comparator having its second input connected to the second converter input and its first input connected to the last node in the ordered set of first nodes.

13. An analogue to digital converter as claimed in claim 1, wherein the first and second converter inputs are a pair of differential inputs.

14. An analogue to digital converter as claimed in claim 1, wherein the first converter input voltage is a single-ended input voltage and the second converter input voltage is synthesised from the first converter input voltage so as to maintain the midpoint voltage between the two converter input voltages at the midpoint voltage between the upper and lower supply voltages supplied to the analogue to digital converter.

15. An analogue to digital converter as claimed in claim 1, wherein each said resistor has the same nominal resistance and each said current source is configured to provide a predetermined multiple of a fixed current.

16. An analogue to digital converter as claimed in claim 15, wherein the predetermined multiples are chosen such that, in the absence of input voltages at the first and second converter inputs, the voltages on the nodes in each of the first and second sets form a linear progression.

17. An analogue to digital converter as claimed in claim 15, wherein the predetermined multiples are chosen such that, in the absence of input voltages at the first and second converter inputs, the voltages on the nodes in each of the first and second sets form a logarithmic progression.

18. An analogue to digital converter as claimed in claim 1, wherein the first and second converter input voltages are biased such that the midpoint voltage between the two converter input voltages is maintained at the midpoint voltage between upper and lower supply voltages supplied to the analogue to digital converter.

19. An electronic device comprising an analogue to digital converter as claimed in claim 1.

20. An integrated circuit comprising an analogue to digital converter as claimed in claim 1.

* * * * *

UNITED STATES PATENT AND TRADEMARK OFFICE
CERTIFICATE OF CORRECTION

PATENT NO. : 8,207,881 B2
APPLICATION NO. : 12/769784
DATED : June 26, 2012
INVENTOR(S) : Simon Chang Page 1 of 1

It is certified that error appears in the above-identified patent and that said Letters Patent is hereby corrected as shown below:

On column 7, line 14, "h" is corrected to --the--

On column 9, line 47, "the upper supply voltage" is corrected to --an upper supply voltage--

On column 9, line 50, "the lower supply voltage" is corrected to --a lower supply voltage--

On column 10, line 40, "the upper and lower" is corrected to --upper and lower--

Signed and Sealed this
Twenty-sixth Day of February, 2013

Teresa Stanek Rea
*Acting Director of the United States Patent and Trademark Office*